US006236113B1

United States Patent
Zhang et al.

(10) Patent No.: US 6,236,113 B1
(45) Date of Patent: May 22, 2001

(54) IRIDIUM COMPOSITE BARRIER STRUCTURE AND METHOD FOR SAME

(75) Inventors: Fengyan Zhang; Jer-shen Maa, both of Vancouver; Sheng Teng Hsu, Camas, all of WA (US)

(73) Assignees: Sharp Laboratories of America, Inc., Camas, WA (US); Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/263,970

(22) Filed: Mar. 5, 1999

(51) Int. Cl.$^7$ .................... H01L 21/3205; H01L 21/4763
(52) U.S. Cl. .................... 257/757; 257/751; 257/761; 438/239; 438/643; 438/648; 438/650
(58) Field of Search .................... 257/757, 751, 257/763, 761; 438/396, 253, 646, 643, 644, 648, 683, 650, 652, 654, 656, 657

(56) References Cited

U.S. PATENT DOCUMENTS

| 4,965,656 | * | 10/1990 | Koubuchi et al. | 357/71 |
|---|---|---|---|---|
| 4,990,997 | * | 2/1991 | Nishida | 357/71 |
| 5,008,687 | | 4/1991 | Longman et al. | 346/135.1 |
| 5,489,548 | * | 2/1996 | Nishioka et al. | 438/396 |
| 5,576,579 | * | 11/1996 | Agnello et al. | 257/751 |
| 5,708,284 | | 1/1998 | Onishi | 257/295 |
| 5,729,054 | * | 3/1998 | Summerfelt et al. | 257/751 |
| 5,786,259 | * | 7/1998 | Kang | 438/396 |
| 5,793,057 | | 8/1998 | Summerfelt | 257/55 |
| 5,854,107 | | 12/1998 | Park et al. | 438/254 |
| 5,998,258 | * | 12/1999 | Melnick et al. | 438/253 |

OTHER PUBLICATIONS

Article entitled, "Improvement of Ta Diffusion Barrier Performance in Cu Metallization by Insertion of a Thin Zr Layer Into Ta Film", by J.S. Kwak and H.K. Baik, published in Applied Physics Letters, vol. 72, No. 22, pp. 2832–2834.

Article entitled, "Investigation of Pt/Ta Diffusion Barrier Using Hybrid Conductive Oxide ($RuO_2$) for High Dielectric Applications" by D–S. Yoon and H. K. Baik, published in J. Vac. Sci. Technol. B 16(3), May/Jun 1998, pp. 1137–1141.

Article entitled, "Oxidation Resistance of Tantalum–Ruthenium Dioxide Diffusion Barrier for Memory Capacitor Bottom Electrodes" by D–S Y, H.K. Baik, S–M Lee, C–S Park and S–I Lee, published in Applied Physics Letters, vol. 73, No. 3, Jul. 1998, pp. 324–326.

Article entitled, "Oxide ($CeO_2$)–incorporated new diffusion barrier for Cu metallization" by D–S Yoon, S–M Lee and H. K. Baik, published in 1998 Materials Research Society, Conference Proceedings ULSI XIII, pp. 103–109.

* cited by examiner

*Primary Examiner*—Steven Loke
*Assistant Examiner*—Bernard E. Souw
(74) *Attorney, Agent, or Firm*—David C. Ripma; Matthew D. Rabdau; Scott C. Krieger

(57) ABSTRACT

An Ir combination film has been provided that is useful in forming an electrode of a ferroelectric capacitor. The combination film includes tantalum and oxygen, as well as iridium. The Ir combination film effectively prevents oxygen diffusion, and is resistant to high temperature annealing in oxygen environments. When used with an underlying Ta or TaN layer, the resulting conductive barrier also suppresses to diffusion of Ir into any underlying Si substrates. As a result, Ir silicide products are not formed, which degrade the electrode interface characteristics. That is, the Ir combination film remains conductive, not peeling or forming hillocks, during high temperature annealing processes, even in oxygen. A method for forming an Ir composite film barrier layer and Ir composite film ferroelectric electrode are also provided.

18 Claims, 4 Drawing Sheets

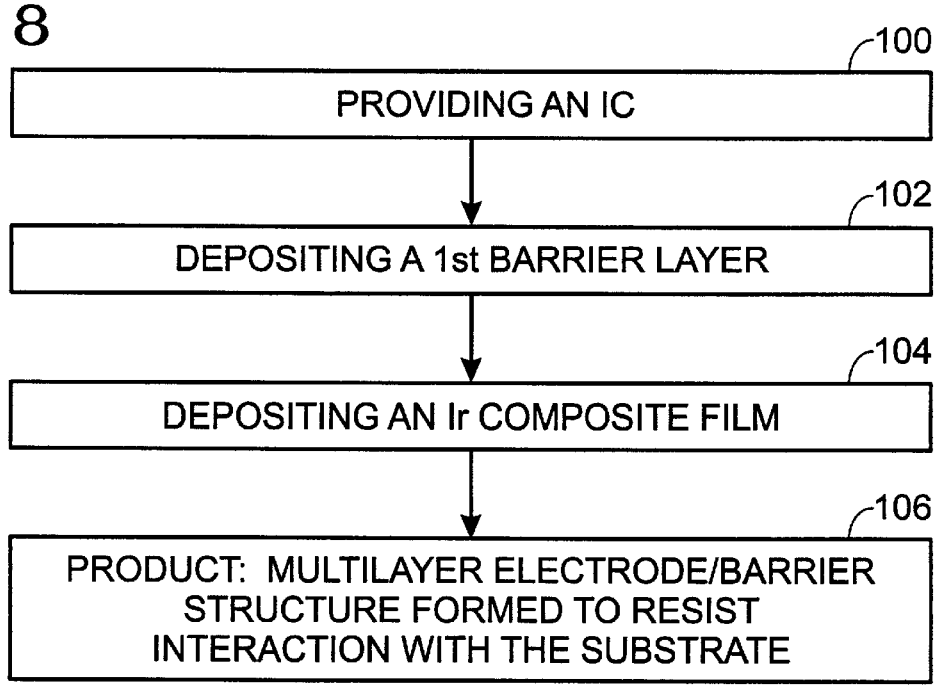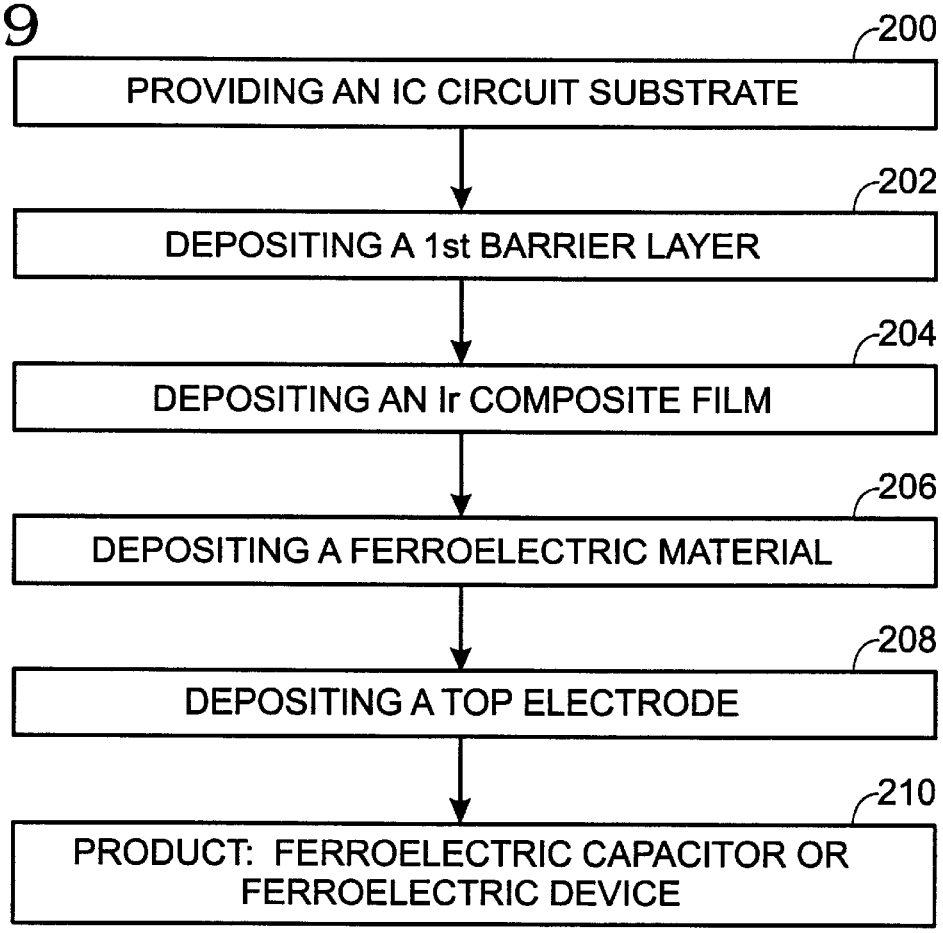

IRIDIUM COMPOSITE BARRIER STRUCTURE AND METHOD FOR SAME

BACKGROUND AND SUMMARY OF THE INVENTION

The present invention is generally related to the fabrication of integrated circuits (ICs) and, more specifically, to the fabrication of a conductive electrode barrier using a composite film of iridium (Ir), tantalum (Ta), and oxygen.

Platinum (Pt) and other noble metals are used in IC ferroelectric capacitors. The use of noble metals is motivated by their inherent chemical resistance. This property is especially desirable under high temperature oxygen annealing conditions, such as those seen in the fabrication of ferroelectric capacitors. In addition, chemical interaction between noble metals and ferroelectric materials such as perovskite metal oxides, is negligible.

Specifically, the above-mentioned noble metals are used as conductive electrode pairs separated by a ferroelectric material. One, or both of the electrodes are often connected to transistor electrodes, or to electrically conductive traces in the IC. As is well known, these ferroelectric devices can be polarized in accordance with the voltage applied to the electrode, with the relationship between charge and voltage expressed in a hysteresis loop. When used in memory devices, the polarized ferroelectric device can be used to represent a "1" or a "0". These memory devices are often called ferro-RAM, or FRAM. Ferroelectric devices are nonvolatile. That is, the device remains polarized even after power is removed from the IC in which the ferroelectric is imbedded.

There are problems in the use of metal, even noble metal electrodes. Pt, perhaps the widely used noble metal, permits the diffusion of oxygen, especially during high temperature annealing processes. The diffusion of oxygen through Pt results in the oxidation of the neighboring barrier and substrate material. Typically, the neighboring substrate material is silicon or silicon dioxide. Oxidation can result in poor adhesion between the Pt and neighboring layer. Oxidation can also interfere with the conductivity between neighboring substrate layers. Silicon substrates are especially susceptible to problems occurring as a result of oxygen diffusion. The end result may be a ferroelectric device with degraded memory properties. Alternately, the temperature of the IC annealing process must be limited to prevent the degradation of the ferroelectric device.

Various strategies have been attempted to improve the interdiffusion, adhesion, and conductivity problems associated with the use of noble metals as a conductive film in IC fabrication. Titanium (Ti), titanium oxide ($TiO_2$), and titanium nitride (TiN) layers have been interposed between a noble metal and silicon (Si) substrates to suppress the interdiffusion of oxygen. However, Ti layers are generally only effective below annealing temperatures of 600 degrees C. After a 600 degree C. annealing, Pt diffuses through the Ti layer to react with silicon, forming a silicide product. Further, the Pt cannot stop the oxygen diffusion. After a high temperature annealing, a thin layer of silicon oxide may be formed on the silicon surface, which insulates contact between silicon and the electrode.

Other problems associated with the annealing of a Pt metal film are peeling and hillock formation. Both these problems are related to the differences in thermal expansion and stress of Pt with neighboring IC layers during high temperature annealing. A layer of Ti overlying the Pt film is known to reduce stress of the Pt film, suppressing hillock formation.

Ir has also been used in attempts to solve the oxygen interdiffusion problem. Ir is chemically stable, having a high melting temperature. Compared to Pt, Ir is more resistant to oxidation and oxygen diffusion. Further, even when oxidized, iridium oxide remains conductive. When layered next to Ti, the Ir/Ti barrier is very impervious to oxygen interdiffusion. However, Ir can diffuse through Ti. Like Pt, Ir is very reactive with silicon or silicon dioxide. Therefore, a bilayered Ir/Ti or Ir/TiN barrier is not an ideal barrier metal.

Co-pending application Ser. No. 09/263,595, entitled "Iridium Conductive Electrode/Barrier Structure and Method for Same", invented by Zhang et al., and filed on Mar. 5, 1999, discloses a multilayered Ir/Ta film that is resistant to interdiffusion.

It would be advantageous if alternate methods were developed for the use of Ir as a conductor, conductive barrier, or electrode in IC fabrication. It would be advantageous if the Ir could be used without interaction to an underlying Si substrate.

It would be advantageous if an Ir film could be altered to improve interdiffusion properties. Further, it would be advantageous if this improved type of Ir film could be layered with an interposing film to prevent the interaction of Ir with a silicon substrate. It would be advantageous if the multilayered film including a layer of Ir could resist the interdiffusion of oxygen at high annealing temperatures. It would also be advantageous if the multilayered film including Ir was not susceptible to peeling problems and hillock formation.

It would be advantageous if an altered Ir film could be produced which remains electrically conductive after annealing at high temperatures and oxygen ambient conditions.

Accordingly, a highly temperature stable conductive barrier layer for use in an integrated circuit is provided. The barrier comprises an underlying silicon substrate, a first barrier film including tantalum (Ta) overlying the substrate, and an iridium-tantalum-oxygen (Ir—Ta—O) composite film overlying the first barrier film. The Ir—Ta—O composite film remains conductive after high temperature annealing processes in an oxygen environment. Further, the Ir composite film resists hillock formation, and resists peeling.

In some aspects of the invention a second barrier film, including a noble metal, overlies the Ir—Ta—O composite film. The second barrier film improves the Ir—Ta—O interface to subsequently deposited layers, and limits the diffusion of oxygen into the Ir—Ta—O film.

Typically, the first barrier film is selected from the group of materials consisting of Ta, tantalum silicon nitride (TaSiN), and tantalum nitride (TaN). The first barrier layer has a thickness in the range of approximately 10 to 100 nanometers (nm).

In some aspects of the invention, the barrier is used to for an electrode in a ferroelectric device. Then, a ferroelectric film overlies the Ir—Ta—O film. Alternately, the second barrier layer intervenes between the Ir—Ta—O film and the ferroelectric film. A conductive metal film made of a noble metal, the above-mentioned Ir composite film, or other multilayered conductive top electrode overlies the ferroelectric film. The ferroelectric film is capable of storing charges between said top and Ir—Ta—O electrodes.

Specifically, the Ir composite film includes the following materials. Either Ir, Ta, and oxygen, or Ir, Ta, and $IrO_2$, or Ir, Ta, and $Ta_2O_5$, or $IrO_2$ and $Ta_2O_5$, or $IrO_2$, $Ta_2O_5$, Ir, and Ta, or Ir and $Ta_2O_5$, or Ta and $IrO_2$, or $IrO_2$, $Ta_2O_5$, and Ir, or $IrO_2$, $Ta_2O_5$, and Ta. Further, the above-mention Ir composite film groups are intended to include gamma-phase variations of $Ta_2O_5$ and (Ta, O). Typically, the Ir—Ta—O composite film has a thickness in the range of approximately 10 to 500 nm.

Also provided is a method for forming a highly temperature stable conductive barrier layer overlying an integrated circuit substrate, the method comprising the steps of:

a) depositing a first barrier layer including tantalum overlying the substrate; and b) depositing an iridium-tantalum-oxygen composite film overlying the first barrier layer, whereby a multilayer structure is formed that is resistive to interaction with the substrate.

The Ir—Ta—O composite film and first barrier layer are deposited through by deposition methods selected from the group consisting of physical vapor deposition (PVD), chemical vapor deposition (CVD), and metal organic CVD (MOCVD). In some aspects of the invention Step b) includes cosputtering both Ir and Ta targets at a power in the range of approximately 200 to 400 watts, with the power on the Ta target greater than, or equal to the power on the Ir target, and in which the Ar to $O_2$ ratio is approximately 1:X, where X is greater than, or equal to 1.

Some aspects of the invention include a further step, following Step b), of:

c) depositing a second barrier layer including a noble metal overlying the Ir—Ta—O composite film, whereby the second barrier layer resist the diffusion of oxygen into the Ir—Ta—O film, improving the Ir—Ta—O film interface to subsequently deposited materials. The second barrier film selected from the group consisting of Ir, Ru, $IrO_2$, platinum (Pt), and $RuO_2$, and has a thickness in the range of approximately 10 to 200 nm. Step c) includes depositing the second barrier layer through deposition methods selected from the group consisting of physical vapor deposition (PVD), chemical vapor deposition (CVD), and metal organic CVD (MOCVD).

When a ferroelectric capacitors is to formed further steps follow Step c), of:

d) depositing a ferroelectric material overlying the Ir—Ta—O composite layer; and e) depositing a conductive top electrode overlying the ferroelectric material, whereby a ferroelectric capacitor is formed.

BRIEF DESCRIPTION OF THE DRAWINGS

FIG. 8 is a flowchart illustrating steps in a method for forming a highly temperature stable conductive barrier layer, such as used in a ferroelectric capacitor.

FIG. 9 is a flowchart depicting steps in the formation of a ferroelectric capacitor, using the conductive barrier Ir composite film of the present invention.

DETAILED DESCRIPTION OF THE PREFERRED EMBODIMENT

Figure 1:
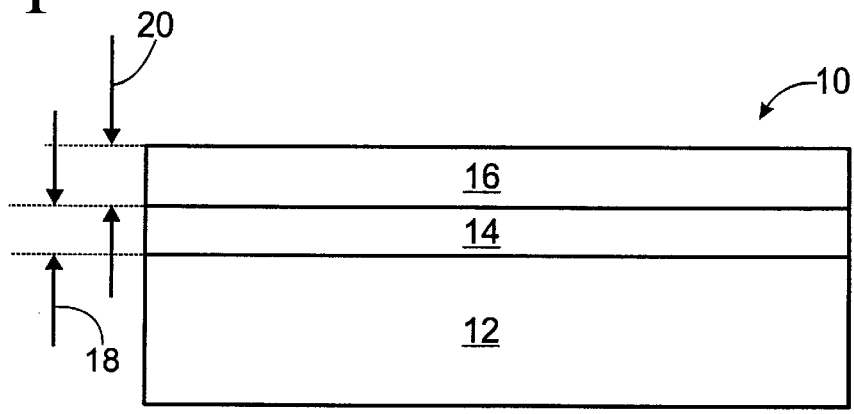
FIGS. 1–3 illustrate steps in a completed, highly temperature stable conductive barrier layer, for use in an integrated circuit.
Figure 2:
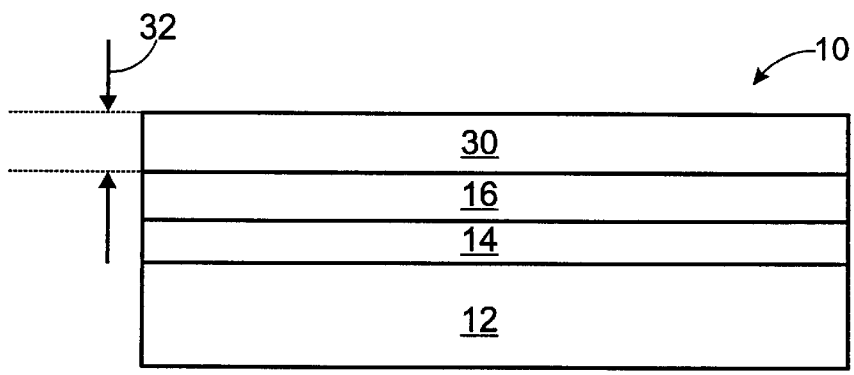
Figure 3:
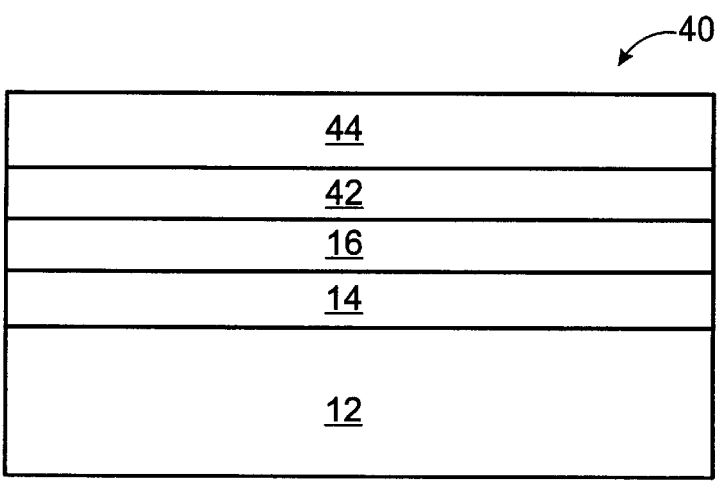

FIGS. 1–3 illustrate steps in a completed, highly temperature stable conductive barrier layer, for use in an integrated circuit. Specifically, the conductive barrier is useful as an electrode in a ferroelectric capacitor. FIG. 1 depicts conductive barrier 10 comprising a substrate 12, a first barrier film 14, including tantalum (Ta), overlying substrate 12, and an iridium-tantalum-oxygen (Ir—Ta—O) composite film 16 overlying first barrier film 14. Ir—Ta—O composite film 16 remains conductive after high temperature annealing processes in an oxygen environment.

Substrate 12 is selected from the group of materials consisting of silicon, polysilicon, silicon dioxide, and silicon-germanium compounds, whereby first barrier layer 14 prevents the formation of Ir silicide products. First barrier film 14 is selected from the group of materials consisting of Ta, tantalum silicon nitride (TaSiN), and tantalum nitride (TaN). First barrier layer 14 has a thickness 18 in the range of approximately 10 to 100 nanometers (nm).

Specifically, several types of Ir composite film 16 are possible. Conductive barrier layer 10 includes Ir—Ta—O composite film 16 selected from the group consisting of the following materials: Ir and Ta; Ir, Ta, and oxygen; Ir, Ta, and $IrO_2$; Ir, Ta, and $Ta_2O_5$; $IrO_2$ and $Ta_2O_5$; $IrO_2$, $Ta_2O_5$, Ir, and Ta; Ir and $Ta_2O_5$; Ta and $IrO_2$; $IrO_2$, $Ta_2O_5$, and Ir; $IrO_2$, $Ta_2O_5$, and Ta, with the $Ta_2O_5$ of the above-mentioned groups including gamma-phase variations of $Ta_2O_5$ and (Ta, O). Ir—Ta—O composite film 16 has a thickness 20 in the range of approximately 10 to 500 nm.

FIG. 2 depicts another aspect of conductive barrier film 10 of FIG. 1. Conductive barrier layer 10 further comprises a second barrier film 30, including a noble metal, overlying Ir—Ta—O composite film 16. Second barrier film 30 improves the Ir—Ta—O film 16 interface to subsequently deposited layers (not shown), and limits the diffusion of oxygen into Ir—Ta—O film 16.

Second barrier film 30 is selected from the group of materials consisting of iridium oxide (IrO2), ruthenium oxide (RuO2), Ir, platinum (Pt), and ruthenium (Ru). Second barrier film 30 has a thickness 32 in the range of approximately 10 to 200 nm.

FIG. 3 illustrates conductive barrier layer 10 of FIG. 1 or 2 included as part of a ferroelectric capacitor 40. Ferroelectric capacitor 40 further includes a ferroelectric film 42 overlying Ir—Ta—O film 16. In some aspects of the invention, second barrier layer 30 (not shown) overlies Ir composite film 16. A conductive metal film 44 overlies ferroelectric film 42. In this manner, ferroelectric film 42 is capable of storing charges, or maintaining polarity, between top electrode 44 and Ir—Ta—O electrode 16. Top electrode 44 is a noble metal, multilayered electrode, and Ir composite film 16 is alternative aspects of the invention.

Figure 4:
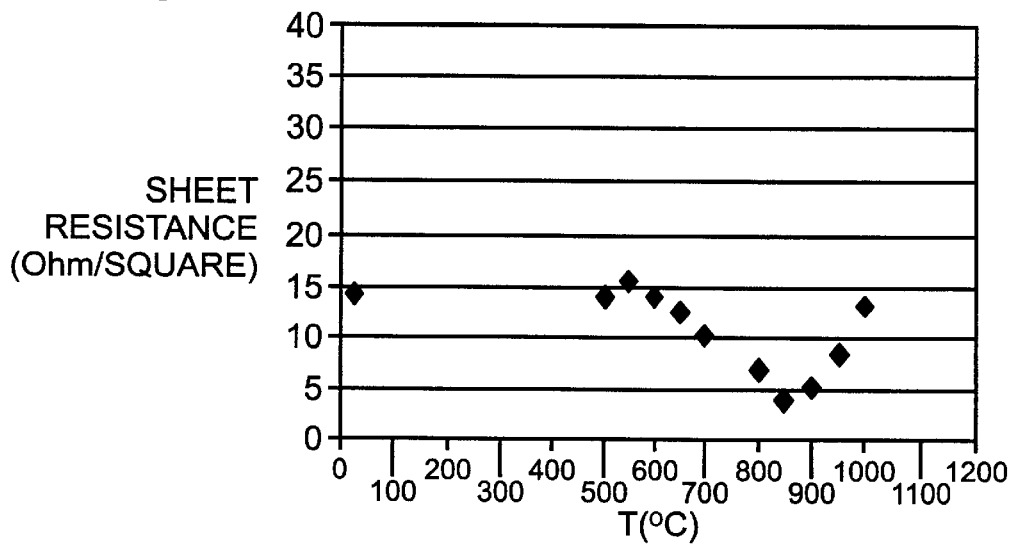
FIG. 4 illustrates the sheet resistance properties of the present invention Ir composite film.

FIG. 4 illustrates the sheet resistance properties of the present invention Ir composite film. A 100 nm film of Ta is deposited on a Si substrate, with a 300 nm film of Ir—Ta—O overlying the Ta film. Experimental results show that the Ir—Ta—O/Ta/Si structure can sustain at least a 1000 degree C. oxygen annealing for 5 minutes without forming hillocks or peeling. The sheet resistance increases slightly from 500 to 550 degrees C., and begins to decrease above 600 degrees C. A minimum value is obtained at 850 degrees C., and above 900 degrees C., the sheet resistance begins to rise. However, the sheet resistance corresponding to 1000 degrees C. is still less than pre-annealing sheet resistance. That is, the Ir—Ta—O film remains conductive after a 1000 degree oxygen annealing for 5 minutes.

The symbol "/", as used herein, defines a layering of films, so that Ir/Ta is a layer of Ir film overlying a Ta film. The symbol "—", as used herein, defines a combination or mixture of elements, so that a Ir—Ta film is a composite film which includes elements of Ir and Ta.

Figure 5:
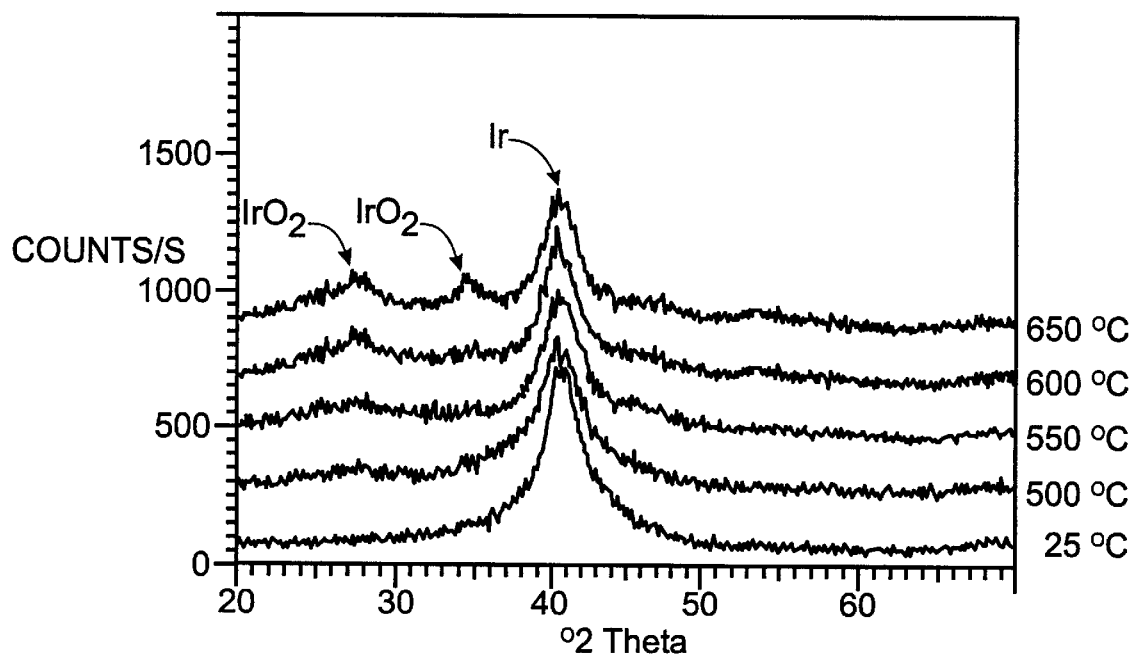
FIG. 5 illustrates X-ray diffraction (XRD) spectra of the Ir composite film of the present invention at a variety of annealing temperatures below 650 degrees C., in an oxygen ambient environment for 5 minutes.

FIG. 5 illustrates X-ray diffraction (XRD) spectra of the Ir composite film of the present invention at a variety of annealing temperatures below 650 degrees C., in an oxygen ambient environment for 5 minutes. The as-deposited Ir composite film includes very fine polycrystalline Ir. $IrO_2$ and $Ta_2O_5$ peaks are not apparent, but they may be present in the amorphous state. During oxygen annealing below 650 degrees C., no crystallized Ta oxide peaks are observed, while some increase in intensity is corresponding to $IrO_2$. This observation indicates that $IrO_2$ has started to crystallize, and that the grain size of the existing crystals are growing.

Figure 6:
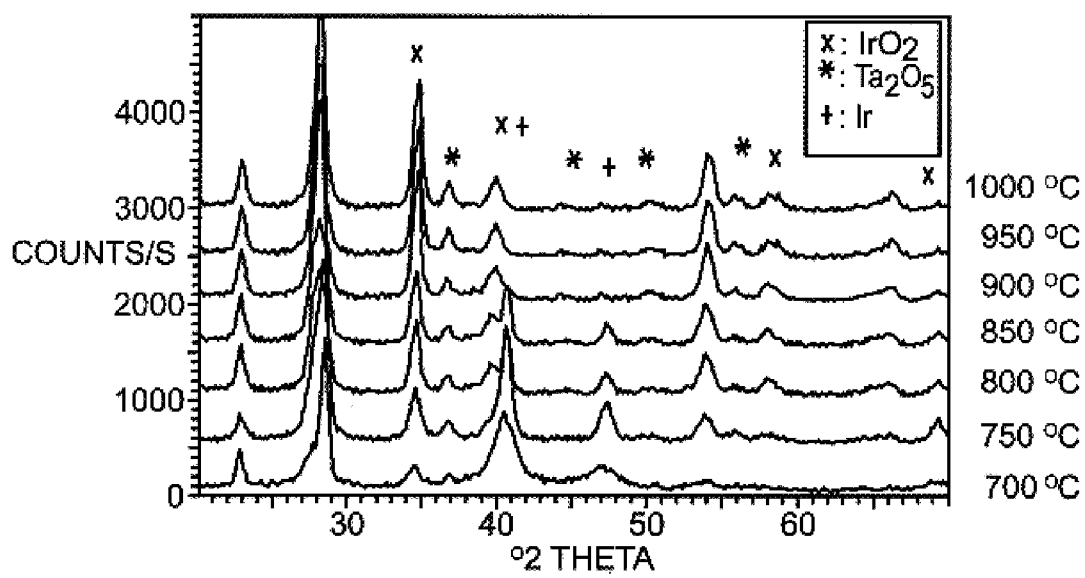
FIG. 6 illustrates XRD spectra of the Ir composite film of the present invention at a variety of annealing temperatures above 650 degrees C., in an oxygen ambient environment for 5 minutes.

FIG. 6 illustrates XRD spectra of the Ir composite film of the present invention at a variety of annealing temperatures above 650 degrees C., in an oxygen ambient environment for 5 minutes. Above 700 degrees C., both crystallized $Ta_2O_5$ and stoichiometric $IrO_2$ peaks are observed. This phenomena corresponds to a decrease in sheet resistance. At higher temperatures, the $IrO_2$ peaks continue to increase, while the Ir peaks decrease. Above 900 degrees C., the intensity of the Ir peaks is very weak, and no intensity increase is apparent in the $IrO_2$ peaks. These occurrence are consistent with the increase of sheet resistance above 850 degrees C. Intensity changes in the Ta2O5 peaks are not apparent above 700 degrees C. Further, no tantalum silicide or Ir silicide are observed, which indicates that the barrier properties of the Ir composite film have not degraded.

Figure 7:
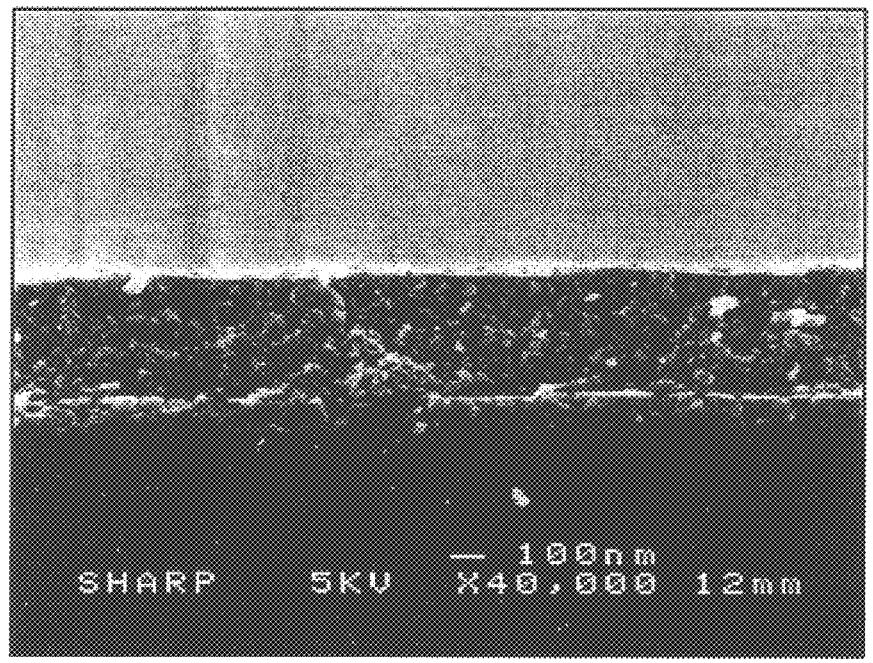
FIG. 7 is a picture of a cross-sectional view of the present invention Ir—Ta—O film overlying a silicon substrate.

FIG. 7 is a picture of a cross-sectional view of the present invention Ir—Ta—O film overlying a silicon substrate. FIG. 7 demonstrates the integrity of the film after a 950 degrees C. oxygen annealing for 5 minutes. No hillocks have been formed and no peeling has occurred between the various layers of film.

FIG. 8 is a flowchart illustrating steps in a method for forming a highly temperature stable conductive barrier layer, such as used in a ferroelectric capacitor. Step 100 provides an integrated circuit substrate. The substrate is selected from the group of materials consisting of silicon, polysilicon, silicon dioxide, and silicon-germanium compounds. Step 102 deposits a first barrier layer including tantalum (Ta) overlying the substrate. Step 102 includes depositing a first barrier selected from the group of materials consisting of Ta, tantalum silicon nitride (TaSiN), and tantalum nitride (TaN). Step 102 includes depositing the first barrier layer through deposition methods selected from the group consisting of CVD, PVD, and MOCVD. In some aspects of the invention, Step 102 includes depositing the first barrier layer at approximately room temperature. Step 102 also includes depositing the first barrier layer to a thickness in the range of approximately 10 to 100 nm.

Step 104 deposits an iridium-tantalum-oxygen (Ir—Ta—O) composite film overlying the first barrier layer. Step 104 includes depositing the Ir—Ta—O composite film by deposition methods selected from the group consisting of PVD, CVD, and MOCVD. In some aspects of the invention, Step 104 includes depositing the Ir—Ta—O composite film at approximately room temperature. Step 104 includes the Ir—Ta—O composite film being selected from the group consisting of the following materials:

Ir, Ta, and oxygen;
Ir, Ta, and $IrO_2$;
Ir, Ta, and $Ta_2O_5$;
$IrO_2$ and $Ta_2O_5$;
$IrO_2$, $Ta_2O_5$, Ir, and Ta;
Ir and Ta;
Ir and $Ta_2O_5$;
Ta and $IrO_2$;
$IrO_2$, $Ta_2O_5$, and Ir;
$IrO_2$, $Ta_2O_5$, and Ta; and
in which the $Ta_2O_5$ in the above-mentioned groups includes gamma-phase variations of $Ta_2O_5$ and (Ta, O). Step 104 includes depositing the Ir—Ta—O composite film layer to a thickness in the range of approximately 10 to 500 nm.

Step 106 is a product, where a multilayer structure is formed that is resistive to interaction with the substrate.

In some aspects of the invention, Step 104 includes depositing the Ir—Ta—O composite film through PVD deposition. Specifically, dc cosputtering is used with separate Ir and Ta targets in an oxygen environment. It is understood that Argon (Ar) is typically used in all sputtering processes, and the oxygen is used with Ar in some aspects of the invention. Further, Step 104 includes cosputtering both Ir and Ta targets at a power in the range of approximately 200 to 400 watts, and in which the Ar to $O_2$ ratio is approximately 1:X, where X is greater than, or equal to 1. The power on the Ta target is greater than, or equal to the power on the Ir target. In some aspects of the invention, the multiple source targets are selected from the group of target materials consisting of Ir, Ta, composites of Ir and Ta, composites of Ir and oxygen, and composites of Ta and oxygen. When the source target includes oxygen, it is possible to form a Ir—Ta—O film, even when sputtering does not occur in an oxygen environment.

Alternately, Step 104 includes depositing the Ir—Ta—O composite film through PVD deposition, dc or RF (radio frequency) sputtering with a single, composite source, Ir—Ta target in an Ar environment. The Ir—Ta composite source target is selected from the group of materials consisting of Ta—$IrO_2$, Ir—$Ta_2O_5$, $IrO_2$$Ta_2O_5$, Ir/Ta/$IrO_2$/$Ta_2O_5$, Ir—$IrO_2$—$Ta_2O_5$, Ir—Ta—$IrO_2$, Ir—Ta—$Ta_2O_5$, Ta—$IrO_2$—$Ta_2O_5$. As mentioned above, in some aspects of the invention the sputtering process of Step 104 also includes the use of $O_2$, as well as Ar.

In some aspects of the invention Step 104 includes annealing at a temperature in the range between approximately 600 and 1000 degrees C., for a duration of time in the range of approximately 1 to 30 minutes. In this manner, the composite film structure is stabilized, while maintaining good conductivity.

Some aspects of the invention include a further step, following Step 104. Step 105 (not shown) deposits a second barrier layer including a noble metal overlying the Ir—Ta—O composite film, whereby the second barrier layer resist the diffusion of oxygen into the Ir—Ta—O film, improving the Ir—Ta—O film interface to subsequently deposited materials. Step 105 includes depositing a second barrier film selected from the group consisting of Ir, Ru, $IrO_2$, platinum (Pt), and $RuO_2$. Step 105 includes depositing the second barrier layer to a thickness in the range of approximately 10 to 200 nm. The second barrier layer through deposition methods selected from the group consisting of PVD, CVD, and MOCVD. In some aspects of the invention, Step 105 includes depositing the second barrier layer at approximately room temperature.

FIG. 9 is a flowchart depicting steps in the formation of a ferroelectric capacitor, using the conductive barrier Ir composite film of the present invention. Steps 200 through 204 replicate Steps 100 through 104 of FIG. 8. As above, a Step 205 (not shown) deposits a second barrier film selected from the group consisting of Ir, Ru, IrO$_2$, platinum (Pt), and RuO$_2$. Addition steps follow. Step 206 deposits a ferroelectric material overlying the Ir—Ta—O composite layer. Step 208 deposits a conductive top electrode overlying the ferroelectric material. Step 210 is a product, where a ferroelectric capacitor is formed.

An Ir composite film has been provided that is useful in forming an electrode of a ferroelectric capacitor. The composite film includes tantalum and oxygen, as well as iridium. The Ir composite film effectively resists oxygen diffusion to the substrate, and is resistant to high temperature annealing in oxygen environments. When used with an underlying Ta or TaN layer, the resulting conductive barrier also suppresses to diffusion of Ir into any underlying Si substrates. As a result, Ir silicide products are not formed which degrade the electrode interface characteristics. The Ir composite film remains conductive, and resists peeling and hillock formation during high temperature annealing processes, even in an oxygen atmosphere. The above-mentioned Ir composite film is useful in the fabrication of nonvolatile memories, such as metal ferroelectric metal oxide silicon (MFMOS), metal ferroelectric metal silicon (MFMS), metal ferroelectric insulator silicon (MFIS), metal insulator ferroelectric silicon (MIFS), metal ferroelectric silicon (MFS), capacitors, pyroelectric infrared sensors, optical displays, optical switches, piezoelectric transducers, and surface acoustic wave (SAW) devices. Additionally, the Ir composite film is useful in other high temperature oxidation environments. For example, in aerospace applications such a material used in the fabrication of rocket thrusters. Other variations and embodiments will occur to those skilled in the art.

What is claimed is:

1. On an integrated circuit substrate, a highly temperature stable multilayer electrode, the electrode comprising:
    a first layer on the substrate, said first layer including tantalum (Ta); and
    a layer of iridium-tantalum-oxygen (Ir—Ta—O) composite overlying said first layer, whereby the multilayer electrode remains conductive after high temperature annealing processes in an oxygen environment.

2. A multilayer electrode as in claim 1 further comprising:
    a second layer including a noble metal overlying said layer of Ir—Ta—O composite.

3. A multilayer electrode as in claim 2 in which said second layer including a noble metal overlying said layer of Ir—Ta—O composite is selected from the group of materials consisting of iridium oxide (IrO2), ruthenium oxide (RuO2), Ir, platinum (Pt), and ruthenium (Ru).

4. A multilayer electrode as in claim 3 in which said second layer including a noble metal overlying said layer of Ir—Ta—O composite has a thickness in the range of approximately 10 to 200 nm.

5. A multilayer electrode as in claim 1 including a semiconductor substrate on which the multilayer electrode is formed, said semiconductor substrate being selected from the group of materials consisting of silicon, polysilicon, silicon dioxide, and silicon-germanium compounds, whereby said multilayer electrode inhibits the formation of silicide products.

6. A multilayer electrode as in claim 1 in which said first layer is selected from the group of materials consisting of Ta, tantalum silicon nitride (TaSiN), and tantalum nitride (TaN).

7. A multilayer electrode as in claim 6 in which said first layer has a thickness in the range of approximately 10 to 100 nanometers (nm).

8. A multilayer electrode as in claim 1 further including, on the integrated circuit substrate, the following:
    a ferroelectric film overlying said layer of Ir—Ta—O composite; and
    a conductive metal film overlying said ferroelectric film, whereby a ferroelectric capacitor is formed on the substrate capable of storing charges between said conductive metal film and the multilayer electrode.

9. A multilayer electrode as in claim 1 in which said layer of Ir—Ta—O composite is selected from the group consisting of the following materials:
    Ir, Ta, and oxygen;
    Ir, Ta, and IrO$_2$;
    Ir, Ta, and Ta$_2$O$_5$;
    IrO$_2$ and Ta$_2$O$_5$;
    IrO$_2$, Ta$_2$O$_5$, Ir, and Ta;
    Ir and Ta$_2$O$_5$;
    Ta and IrO$_2$;
    IrO$_2$, Ta$_2$O$_5$, and Ir;
    IrO$_2$, Ta$_2$O$_5$, and Ta; and
    in which said Ta$_2$O$_5$ in said above-mentioned groups include gamma-phase variations of Ta$_2$O$_5$ and (Ta, O).

10. A multilayer electrode as in claim 9 in which said layer of Ir—Ta—O composite has a thickness in the range of approximately 10 to 500 nm.

11. An integrated circuit structure comprising:
    an integrated circuit substrate; and
    a layer of iridium-tantalum-oxygen (Ir—Ta—O) composite material on the substrate, said Ir—Ta—O layer serving as a conductive electrode which remains conductive after high temperature annealing processes carried out in an oxygen environment.

12. An integrated circuit structure as in claim 11 further including a second layer overlying said Ir—Ta—O layer, said second layer including a noble metal, whereby said Ir—Ta—O layer and said second layer form a multilayer electrode on the substrate.

13. An integrated circuit structure as in claim 12 in which said second layer is selected from the group of materials consisting of iridium oxide (IrO2), ruthenium oxide (RuO2), Ir, platinum (Pt), and ruthenium (Ru).

14. An integrated circuit structure as in claim 13 in which said second layer has a thickness in the range of approximately 10 to 200 nm.

15. An integrated circuit structure as in claim 11 in which said substrate is selected from the group of materials consisting of silicon, polysilicon, silicon dioxide, and silicon-germanium compounds, whereby said Ir—Ta—O electrode inhibits the formation of suicide products.

16. An integrated circuit structure as in claim 11 further including a ferroelectric film overlying said Ir—Ta—O layer, and a conductive metal film overlying said ferroelectric film, whereby a ferroelectric capacitor is formed on the substrate capable of storing charges between said conductive metal film and the Ir—Ta—O layer.

17. An integrated circuit structure as in claim 11 in which said Ir—Ta—O layer is selected from the group consisting of the following materials:

Ir, Ta, and oxygen;
Ir, Ta, and $IrO_2$;
Ir, Ta, and $Ta_2O_5$;
$IrO_2$ and $Ta_2O_5$;
$IrO_2$, $Ta_2O_5$, Ir, and Ta;
Ir and $Ta_2O_5$;
Ta and $IrO_2$;
$IrO_2$, $Ta_2O_5$, and Ir;
$IrO_2$, $Ta_2O_5$, and Ta; and
in which said $Ta_2O_5$ in said above-mentioned groups include gamma-phase variations of $Ta_2O_5$ and (Ta, O).

18. An integrated circuit structure as in claim 17 in which said Ir—Ta—O layer has a thickness in the range of approximately 10 to 500 nm.

* * * * *